United States Patent [19]
Kikinis

[11] Patent Number: 5,539,616
[45] Date of Patent: *Jul. 23, 1996

[54] MODULAR PORTABLE COMPUTER

[75] Inventor: Dan Kikinis, Saratoga, Calif.

[73] Assignee: Elonex Technologies, Inc., Sunnyvale, Calif.

[*] Notice: The term of this patent shall not extend beyond the expiration date of Pat. No. 5,278,509.

[21] Appl. No.: 159,078

[22] Filed: Nov. 29, 1993

Related U.S. Application Data

[63] Continuation-in-part of Ser. No. 97,946, Jul. 26, 1993, Pat. No. 5,278,730, which is a continuation of Ser. No. 905,480, Jun. 29, 1992, abandoned.

[51] Int. Cl.⁶ .................. G06F 1/16; H05K 7/10
[52] U.S. Cl. .............. 361/686; 361/683; 361/726; 361/727
[58] Field of Search ............ 364/708.1; 439/928; 345/169, 905; 312/223.2; 361/679–686, 724–727, 752, 796, 826, 827

[56] References Cited

U.S. PATENT DOCUMENTS

| | | | |
|---|---|---|---|
| 4,545,023 | 10/1985 | Mizzi | 361/680 X |
| 4,749,364 | 6/1988 | Arney et al. | 361/680 |
| 5,278,730 | 1/1994 | Kikinis | 361/686 |
| 5,331,509 | 7/1994 | Kikinis | 361/686 |

*Primary Examiner*—Michael W. Phillips
*Attorney, Agent, or Firm*—Donald R. Boys

[57] ABSTRACT

A modular computer has a framework with module bays for receiving CPU modules, power modules, and peripheral function modules such as floppy and hard disk drives. The framework has a built-in compressed bus and a variety of function modules which can be plugged into any one of the module bays. Function modules include, but are not limited to, CPU, power, floppy disk, hard disk, RAM memory, LAN communication, modem, FAX communication, and data acquisition. In some embodiments function modules are provided for communicating with separate input means, such as voice, keyboards, and pen-pads. In one aspect the module bays and the function modules are configured according to dimensional and connective standards of the Personal Computer Memory Card International Association.

14 Claims, 18 Drawing Sheets

MODULAR PORTABLE COMPUTER

CROSS REFERENCE TO RELATED DOCUMENTS

This application is a continuation-in-part of application Ser. No. 08/097,946, filed Jul. 26, 1993, now issued as U.S. Pat. No. 5,278,730, which is continuation of application Ser. No. 07/905,480, filed Jun. 29, 1992, abandoned.

FIELD OF THE INVENTION

The present invention is in the area of portable computer systems, and is particularly relevant to portable computers known as notebook, sub-notebook, and palmtop computers.

BACKGROUND OF THE INVENTION

Portable computers are popular among computer users who travel and need to take their work along, and there is a tendency in the marketplace to smaller and smaller versions of portable computers. They are smaller and lighter than laptops, and are therefore more portable. The evolution to smaller and lighter portable computers, however, is not without problems. For one thing, smaller portable computers means less space for battery packs, which usually means shorter useful life between recharges. Another problem related to smaller size is a difficulty in providing versatility. Smaller size naturally means less space to provide a broad choice in peripheral devices and options.

Yet another problem is related to addresses and data byte size. State-of-the-art computers are capable of 32 bit addresses and 32 bit data words. A 32 bit computer, though, typically needs a bus structure with nearly 100 active signals, equating to high pin count and extensive device and component density. Such high density in a small computer creates many other problems, such as problems with heat dissipation. These are a few of the many problems in designing and developing portable computers.

What is needed is a new design for portable computers based on a bus structure allowing 32-bit capability with a minimum pin count, utilizing, for example, multiplexing of address and data on a single 32 bit structure, and utilizing only state-of-the-art technology to minimize power (hence buffer) requirements, which also minimizes heat and equipment complexity and density problems. Also, modularity needs to be raised to a new level by making virtually all components modular and "plug-in", including CPU's, power packs, and all of the various known sorts of peripheral devices.

SUMMARY OF THE INVENTION

In a preferred embodiment of the invention a modular computer is provided, comprising a case having contiguous walls, the case for supporting and enclosing elements of the modular computer; a plurality of separate module bays in a common plane, each module bay comprising a walled cavity in the case having an open outboard end and an inboard end closed by an end wall, wherein the walls of each cavity, including the end wall, comprise an extension of the contiguous walls of the case; a multi-pin electrical connector mounted through the inboard wall of each module bay; an internal bus within the contiguous walls of the case connected to each of the electrical connectors mounted through the inboard walls of the module bays; a display; and an input apparatus attached to the case substantially coplanar with the plane of the module bays.

In one alternative embodiment the input apparatus is a keyboard, and the display is pivoted to close over the keyboard. In another alternative embodiment the display and the input apparatus comprise a touchscreen combination implemented on a surface of the enclosure. In some embodiments the docking bays have guides engaging guides of functional modules, and latching and expulsion apparatus to engage and expel functional modules.

In one preferred embodiment the input means is a keyboard, and the display is a flat panel display hinged to the support structure, and closable over the keyboard for storage and transport.

Functional modules are provided serving a wide variety of functions. One module comprises a CPU, which provides flexibility in CPU type and power, and upgradability as well. A CPU module may also incorporate random access memory and video display control. Function modules also are provided to enhance flexibility in input. Separate input devices, such as a full-size keyboard or a pen-based input tablet may be used with appropriate modules for receiving signals from the separate input devices and providing the signals to the internal bus. An input module for voice input, recognizing human speech, is also provided. Other function modules include Fax modems, telephone modems, floppy drives, hard disk drives, LAN communication modules, and data acquisition modules.

DESCRIPTION OF THE PREFERRED EMBODIMENTS

General Description

Figure 1A:
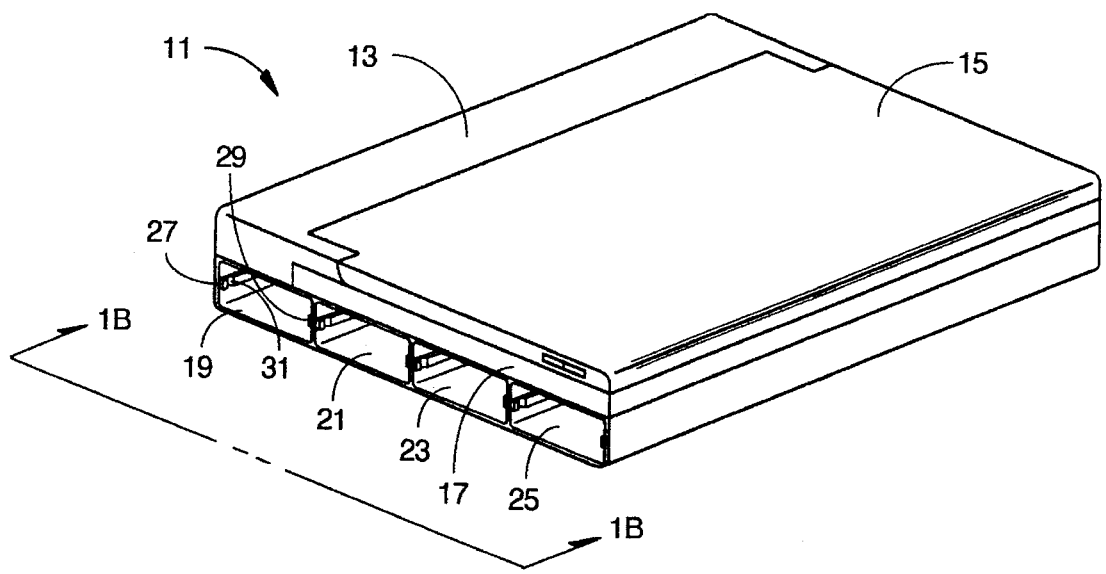
FIG. 1A is an isometric view of a modular notebook computer framework according to an embodiment of the present invention.

FIG. 1A is an isometric drawing of a notebook computer framework 11 according to the invention. Framework 11 comprises a back housing 13, a tilt-up flat panel display 15, shown closed, a keyboard 17, and a plurality of module bays for plugging in function modules. Back housing 13 includes a power unit for converting electrical input on a wide variety of standards to the form required by the computer. For example, there is a port (not shown) for connecting to a standard household outlet, rated at 120 V., 60 Hz, alternating current. The power unit will convert the input to outputs as needed by the computer bus and functional modules. There are also input ports for 6 V. DC, 12 V. DC, 9 V. DC, and others, and the power unit in one embodiment off the present invention is capable of recognizing the input characteristics by sampling, and switching to proper on-board circuitry to utilize the input.

In the embodiment shown by FIG. 1A four module bays 19, 21, 23, and 25 are shown along one side of the framework. There are four more module bays along the other side of the framework opposite the module bays shown. There could be more or fewer module bays, but eight is convenient and a good balance between the need to stay small and simple, and to also have adequate versatility.

Figure 1B:
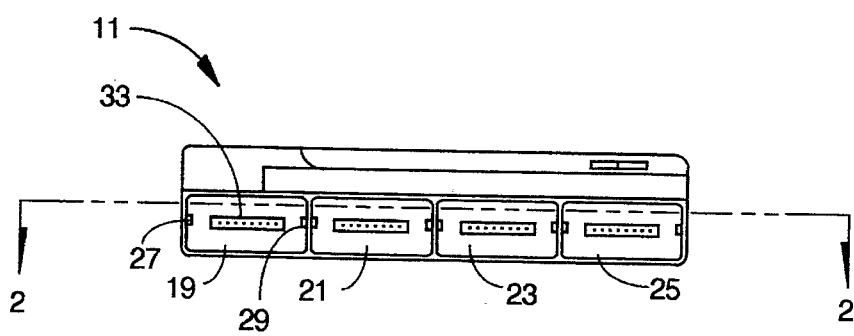
FIG. 1B is a view of the computer framework of FIG. 1A from one side from the vantage of line 1B—1B on FIG. 1A.

FIG. 1B is an end view of the notebook computer framework of FIG. 1 in the direction of arrows 1B—1B of FIG. 1A. Each of the module bays has a set of guide and positioning rails such as rails 27 and 29 in bay 19. The rails are to position and guide a function module inserted into the module bay. Each rail in a set has a detent such as detent 31 for latching a module when the module is fully inserted in the bay. Each bay also has a connector such as connector 33 in bay 19. The connectors are for coupling to a mating connector on a function module inserted in a bay. It will be apparent to a person with skill in the art that there are a number of equivalent ways guide rails, detents, and coupling may be accomplished.

Figure 2:
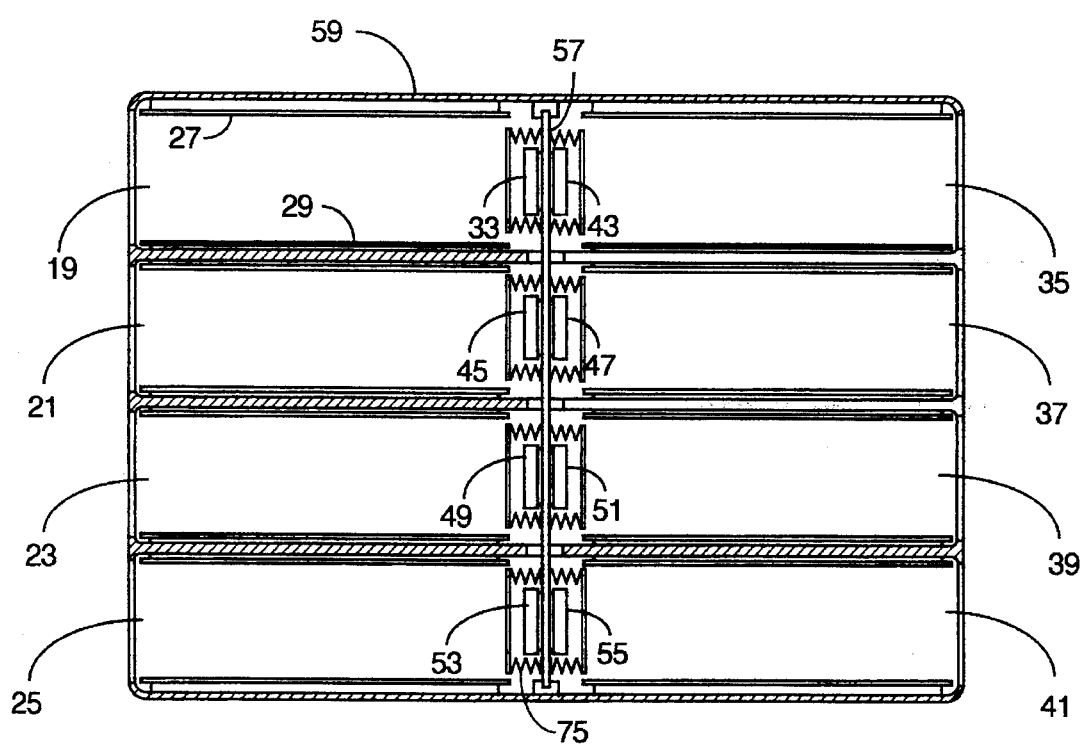
FIG. 2 is a sectioned plan view of the computer framework of FIG. 1A taken according to section line 2—2 of FIG. 1B.

FIG. 2 is a plan section view just above the module bays taken along section line 2—2 of FIG. 1B. Bays 19, 21, 23, and 25 are shown on one side of the section view, and bays 35, 37, 39, and 41 along the opposite side. A printed circuit board structure 57 is fastened in a substantially vertical position down the center of frame 59, and connectors 33, 43, 45, 47.49, 51, 53, and 55 are connected to the printed circuit board structure and present their pin structure outward toward the respective bay areas. In the presently described embodiment the internal connectors are male connectors, but this is not a requirement of the invention.

As also shown in FIG. 1A, each module bay has a pair of opposed rails located vertically at about the midpoint of the height of the module bay. Rails 27 and 29 serve module bay 19, and similar rails are located in each of the other module bays.

Figure 3:
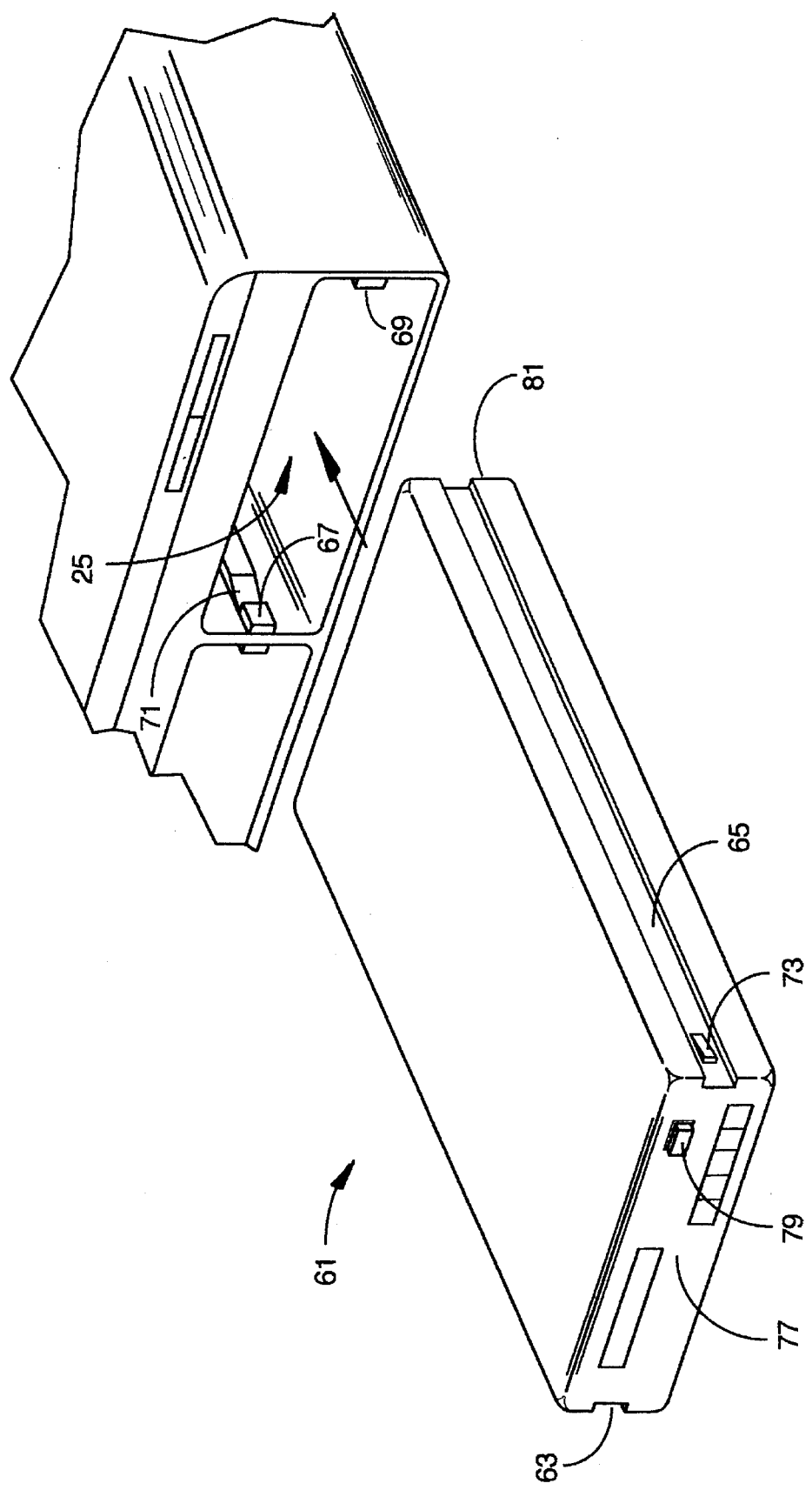
FIG. 3 is an isometric illustration showing a function module according to the present invention associated with a docking bay of the framework of FIG. 1A.

FIG. 3 is an isometric view of a function module 61 according to the invention aligned with module bay 25 of framework 11. Module 61 includes guides 63 and 65 on opposite sides for engaging rails 67 and 69 when module 61 is inserted into bay 25. The module has two spring-loaded detent levers (lever 73 is shown) for engaging detents in guide rails 67 and 69 when the module is fully inserted. Detent 71 is shown in rail 67 in FIG. 3.

Each module bay has a compression spring mechanism engaged by a function module as the module nears full insertion, so there is an outward force on the module when the detent levers engage the detents. Mechanism 75 (FIG. 2) is exemplary. To insert a module one aligns the guides in the module with the guide rails and pushes the module into the module bay until the detents engage. Button 79 on front face 77 of the module is for retracting the detent levers of the module, in which case the spring mechanism ejects the module, much as is the case with some floppy disk drives.

Figure 4:
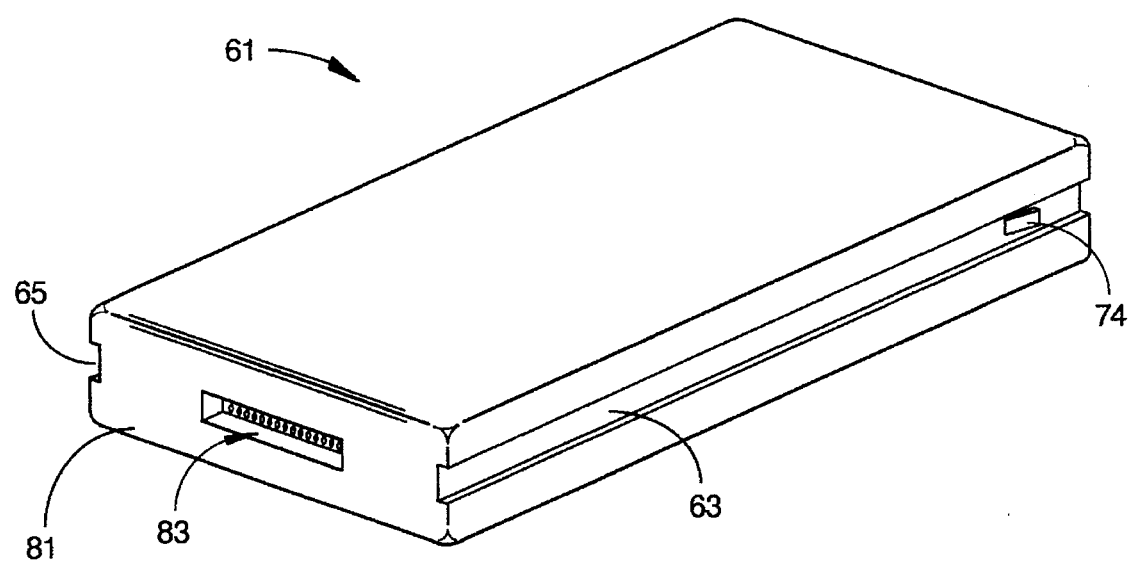
FIG. 4 is another view of a function module according to the present invention.

FIG. 4 is an isometric view of function module 61, showing back face 81 opposite front face 77. The back face includes a recessed female connector receptacle 83 in the preferred embodiment, for mating with male connectors positioned in each pod bay, such as connector 33 in FIG. 1B and FIG. 2. A second detent lever 74 is opposite lever 73 of FIG. 3.

In the embodiment described above, and in many other embodiments, the notebook computer framework of the present invention comprises a frame with module bays and connectors as described above for "plugging in" function modules, power supply units, and other peripheral devices. The framework also comprises display 15, keyboard 17, and an internal bus structure hereinafter termed the Notebus, which is described in additional detail below, in the section titled "Notebus Bus Structure".

The function modules, as represented by module 61 in FIG. 3 and FIG. 4, are provided in a wide variety of different models capable of a wide variety of different functions. For example, framework 11 has no "on-board" CPU, battery power, or system memory. These functions and all other functions are provided by different models of function modules which may be inserted in any one or a combination of the available module bays. Other kinds of function modules that may be inserted include floppy-disk drives, hard-disk drives, "flashcard" memory modules, LAN and modem adapters, Fax modules, speciality modules such as data acquisition modules adapted to specific equipment, and more. The function modules are also described in more detail in the section below titled "Function Modules".

Electronic Architecture

Figure 5:
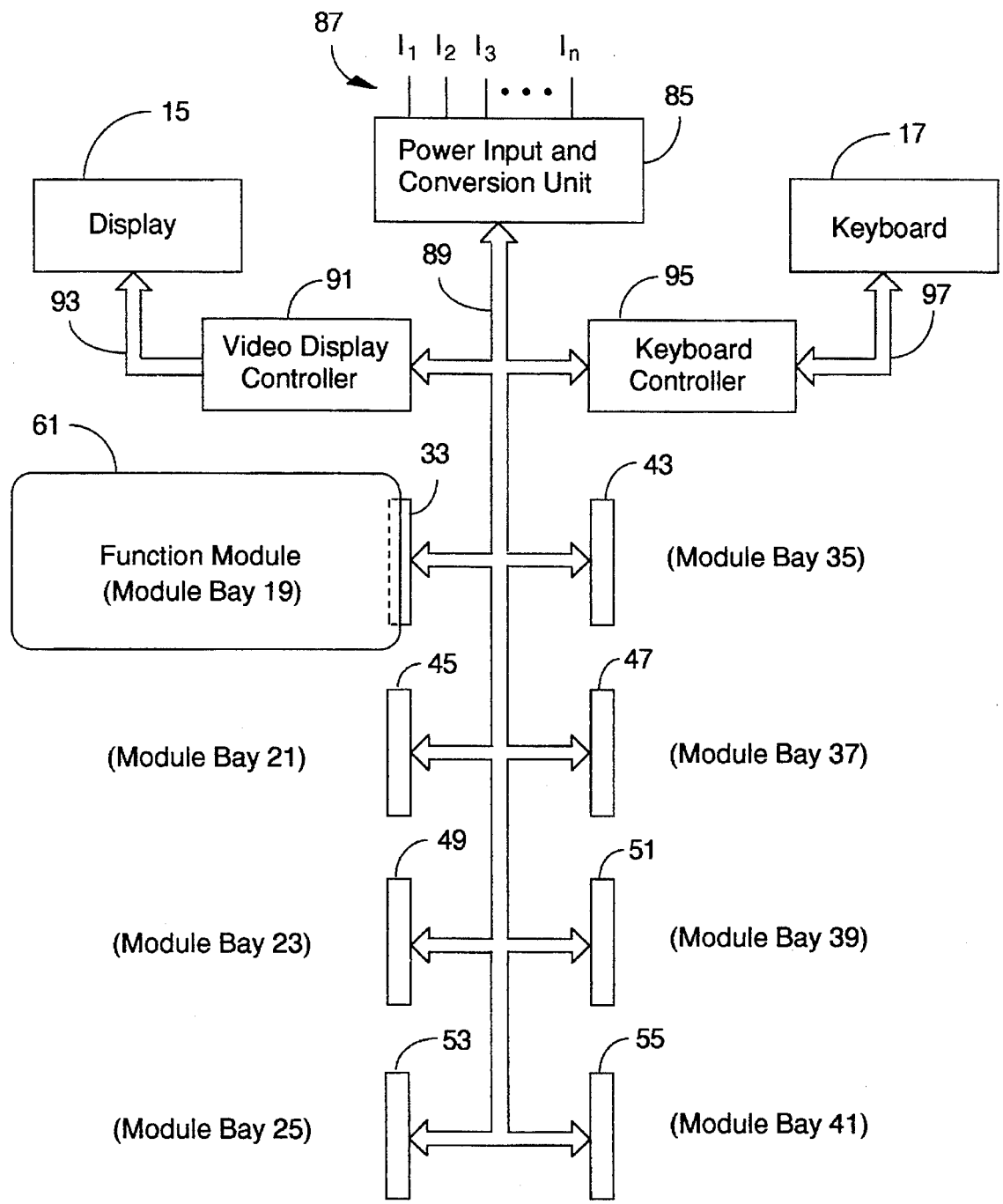
FIG. 5 is a block diagram of a compressed bus and connection to docking bays in a computer framework according to an embodiment of the present invention.

FIG. 5 is a block diagram showing internal elements of Notebook computer framework 11, connected to show the electronic architecture of the notebook computer according to the invention. Power input and conversion unit 85 is housed in back housing 13 (FIG. 1) and has ports 87 for power inputs. Unit 85 senses the input conditions and selects appropriate circuitry to convert the input to the voltages needed to power the other elements of the system. Output from the conversion unit is to Notebus 89, which comprises paths for power as well as for digital information such as data and addresses.

Because there are a wide variety of function modules, as indicated above and described in more detail below, there needs typically to be more than one power line in the Notebus. For example, the notebook computer of the invention comprises hard disk drive modules, and these modules are preferably provided without their own "on board" power source. The motor drive for the hard disk requires a different power (voltage and current) than does a CPU, for example, so there are parallel power lines of differing size and voltage level in the notebus. A typical Notebus will have, for example, a line for 24 V DC, another for 12 V DC, and yet another for 5 V DC, as well as multiple ground lines.

Notebus 89 connects to a video display controller 91 including Video Random Access Memory (VRAM) which both powers and controls display 15, which in the preferred embodiment is a flat panel display driven by analog driver lines on analog bus 93. Notebus 89 also connects to a keyboard controller 95 which powers and controls keyboard 17 over link 97, accepting keystroke input and converting the input to digital data for transmission on Notebus 89. The keyboard controller may be physically mounted in the keyboard or in framework 11.

Notebus 89 also connects as illustrated in FIG. 5 to each of the module bays, such as bay 19, through connectors, such as connector 33. When a function module, such as module 61, is inserted into a module bay, the mating connector in the back of the function module mates with the connector from the Notebus, and circuitry inside the function module is then connected to the Notebus.

Notebus Bus Structure

The Notebus comprises, as stated above, both power and data paths. The digital lines are capable of carrying 32 addresses and conveying data in 32 bit word length. To minimize pin count and routing complexity, addresses and data are multiplexed on a single set of 32 traces in the overall bus structure. One with skill in the art will recognize that this type of bus is what is known in the art as a low-pin-count or compressed bus. In this kind of bus different types of signals, such as address and data signals, share signal paths through multiplexing. For example, the same set of data lines are used to carry both 32-bit addresses and data words of 32-bit length.

In the Notebus of the present invention, some control signals, such as interrupt arbitration signals, may also share the data lines. Typical examples of buses that are exemplary as usable for the Notebus (with the exception of power supply analog lines in the Notebus) are the "S-Bus" implemented by Sun Microsystems, the "Turbochannel" Bus from Digital Equipment Corporation, and buses compatible with the IEEE-488 standard.

The Notebus is a high-speed backplane bus for interconnecting processor, memory and peripheral device modules. The Notebus also supplies standard operating and standby power supply voltages and electrical ground to all module bays.

Function Modules

FIG. 3 and FIG. 4 show, as described above, two different views of a function module according to the present invention. Also as stated above, function modules may have many different functions. There are as many different functions, in fact, as there are possibilities for discrete peripheral devices, plus power and CPU modules. An individual function module is provided for each function, and in each case the function module has a physical size and form compatible with the bays, guide rails, and connectors for "plugging in" to framework 11.

The "face" of a function module, being the exposed face when the module is "plugged in" (see face 77 in FIG. 3) may have elements specific to the type of module. For example, a CPU module may have no indicators or other elements on the front face, while a floppy disc module will typically have an opening for inserting a floppy disk and a "key" or button for releasing and ejecting the floppy disk.

A unique feature of the present invention is that the CPU for the notebook computer is provided as a CPU function module. This provides an ability for a user to tailor the CPU power to the other modules and application for the notebook computer, and an easy upgrade to more powerful CPUs.

Figure 6:
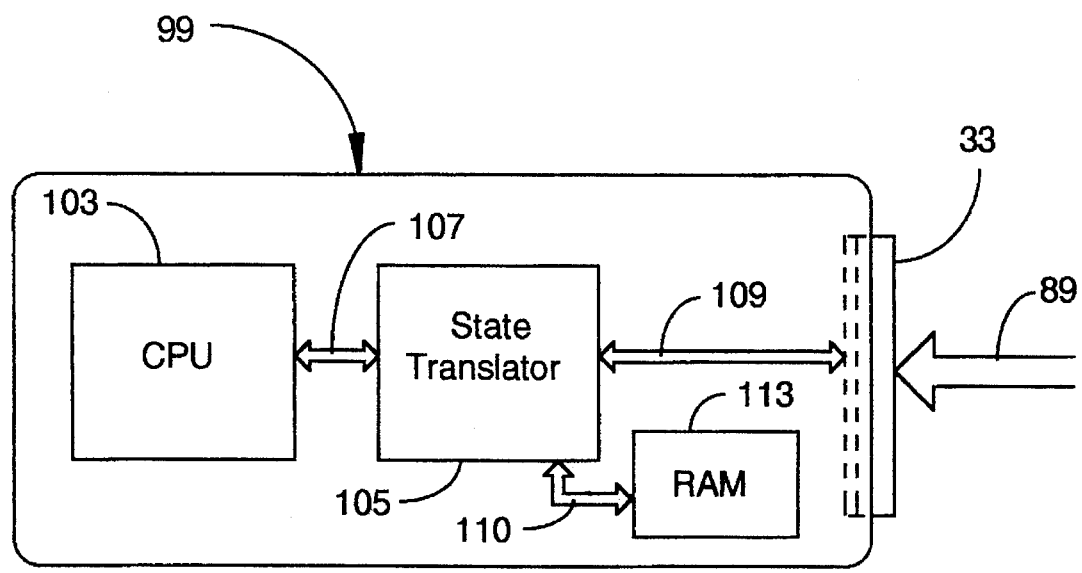
FIG. 6 is a block diagram of a CPU function module according to an embodiment of the present invention.

FIG. 6 is a diagram of a CPU module 99 plugged into a bay in a notebook computer according to the present invention. In this case (referring to FIG. 2) the module is plugged into bay 19 having connector 33. This is exemplary, as the module could just as well be plugged into any open bay of framework 11. By virtue of being plugged into connector 33 or another module connector, internal elements of the CPU module are connected to Notebus 89.

The internal elements for module 99 comprise CPU 103, a state translator 105, and RAM memory 113. CPU 103 may be any of a wide variety of CPUs (also called in some cases MPUs) available in the art, for example Intel 80386 or 80486 models. MIPS, RISC implementations, and many others. CPU 103 communicates with State Translator 105 over paths 107, and State Translator 105 communicates with connector 33, hence Notebus 89, over bus 109 internal to the module, which is an extension of bus 89 when the module is plugged into bus 89.

State translator 105 is a chip or chip set designed to translate commands and requests of the CPU to commands and requests compatible with the Notebus. It was mentioned above that CPU 103 may be one of a wide variety of CPUs, and that. Notebus 89 may be any one of a wide variety of compressed buses. It will be apparent to one with skill in the art that there may be an even wider variety of state translators 105 for translating between the CPU and the Notebus. The state translator is theoretically a different device for each possible combination of CPU and Notebus.

RAM memory module 113 comprises conventional RAM chips mounted on a PCB as is known in the art, and connectable to state translator 105 by a plug or connector interface, such as an edge connector. The purpose of having a RAM module "on board" the CPU module is to provide for rapid memory access, which will be much slower if the RAM is made available in a separate module at one of the other module bays. Memory at another module bay is on the Notebus, and will be subject to bus contention and wait states. The plug-in nature of the RAM unit relative to the CPU module allows different amounts of memory to be provided with a CPU module in the notebook computer of the present invention.

As described above, Notebus 89 comprises not only the shared data and address lines, but also power and ground connections for the modules plugged into the various bays. Paths 109 and 107 therefore comprise power and ground lines for CPU 103 and Translator 105.

If, for example, CPU 103 is an INTEL 80486 microprocessor, State Translator 105 will be a translator for accommodating the state machine of the 80486 to the state machine of the Notebus, which may be any one of the buses described above for bus 89, or another compressed bus. There are many equivalent ways a translator may be implemented for the specific case. Given the manufacturers available design information for the CPU and the equivalent information for bus 89, it is within the skill of workers in the art without undue experimentation to implement the translator and the required connections. This is conventional technology. The implementation of the translator on a module with a CPU to plug into a module bay in the notebook computer is unique to the present invention.

In the invention, state translators may be implemented in a single chip set or circuitry set to be capable of translating between a number of CPUs and a number of different bus possibilities. One might, for example, design and implement a translator with the necessary circuitry and intelligence to translate between three different CPUs and three different compressed buses. The state translator could be made hardware or software programmable to select one CPU and one bus from the available selections at some convenient time in the manufacturing cycle, or even at the time of selection of modules to make up a notebook computer.

As an example of a hardware programmable translator, a translator could be built to have certain traces cut as a near final step in manufacture as a way of selecting the CPU and bus pair. Translators could also be programmable by virtue of on-board EPROM or EEPROM devices. As an example of software programmability, translators could be implemented with microprocessor technology and software programmable. A CPU module could be plugged into a connector on a special programming unit, for example, before installation in a notebook computer according to the present invention, and be sent certain commands to set up on board software to translate between the desired CPU and bus. It will be apparent to one with skill in the art that there are many possible variations in the implementation of the translators.

Figure 7:
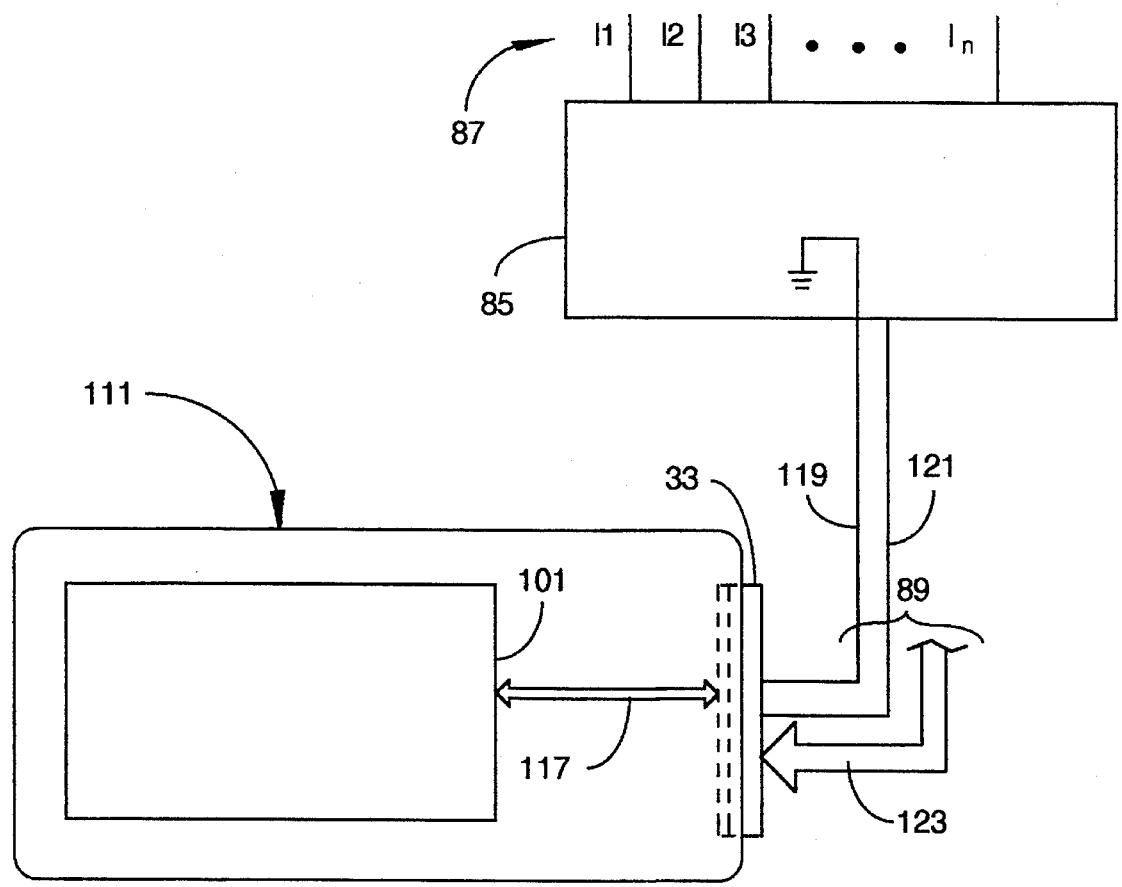
FIG. 7 is a block diagram of a power supply function module according to an embodiment of the present invention, with indication of connections to the internal bus structure and power conversion unit of the computer.

FIG. 7 shows a power module 111 plugged into a bay in the notebook computer according to an embodiment of the present invention. The purpose of a power module is to provide a source of power for the computer, which includes any modules plugged into the module bays. As is common in notebook computers in the art, there may be a battery, typically rechargeable, in framework 11, and the battery may also be replaceable and rechargeable through power input lines 87. In the case of an on-board battery pack, there is the option of using all module bays for other than power packs.

Preferably framework 11, sans function modules, has no power capability other than power plugged into one of input lines 87, which may be converted to the power characteristics needed by the computer and distributed on the power lines of the Notebus. For portability, power is typically supplied by one (or more) power modules 111 plugged into one or more of the module bays.

Module 111 has a battery pack 101 which is connected via lines 117 to (in this case for example) connector 33, and hence to Notebus 89. Because there are several supply lines in the Notebus for supplying power to function modules at different voltage and with different current capability, the power lines in the Notebus For connecting a power module 111 are not the same as the lines for supplying power to a module. There is instead a separate sat of power lines to pins on the module bay connectors, such as connector 33, which connect as input, to power input and conversion unit 85, much as do input ports 87.

In FIG. 7, lines 119 and 121 connect power module 11 to conversion unit 85, where the power input from the power module is sensed and treated as a power source, much as is done for power input lines 87. This power is converted to the needed voltages and current capabilities, and put back out on the power supply output lines to the module bays. In FIG. 7 line 119 is ground, and arrow 123 represents all of the data/address, control, and power output lines to the module bays. Lines represented by arrow 123, plus lines 119 and 121 are Notebus 89. Although not shown in FIG. 7, there are connections for line 119 and for line 121 to each of the module bay connectors.

Power modules such as module 111 may be plugged into a connector on a charging module separate from the notebook computer, using the same connector used for plugging into the Notebus via a module bay of framework 11, and recharged for later use with a modular notebook computer according to the invention. This allows a user to keep spare power modules ready for use, and to recharge modules without connecting the computer itself to a charging unit. Moreover, the provision of power modules allows a user to provide more or less portable time to the notebook computer by using one or more than one power module.

Figure 8:
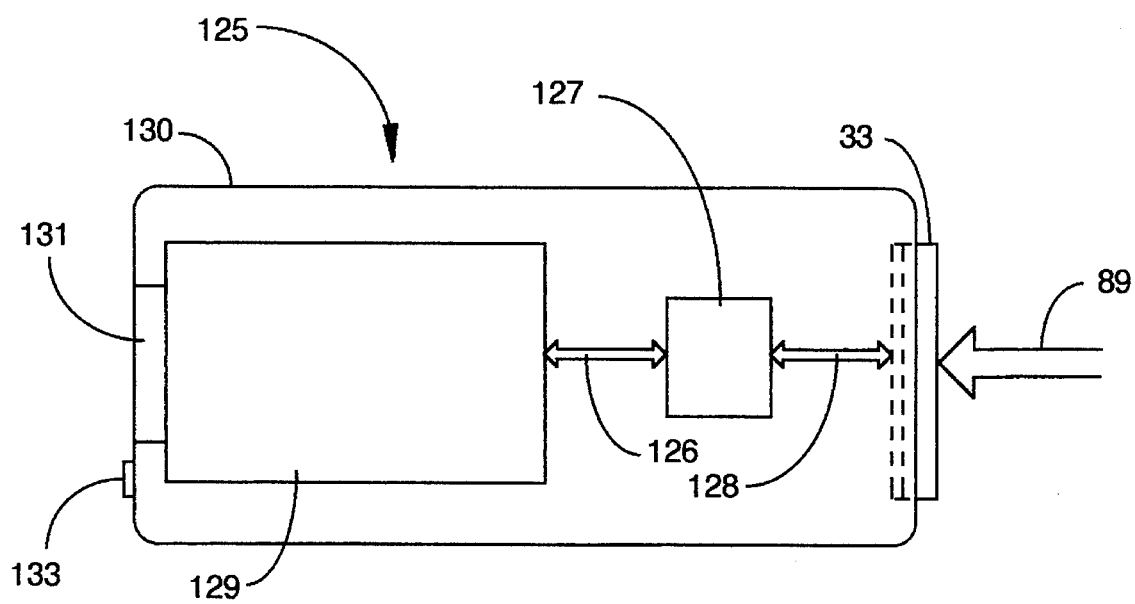
FIG. 8 is a block diagram of a floppy disk drive function module used in the invention.

FIG. 8 shows a floppy disk drive (FDD) module 125 plugged into a module bay in a notebook computer according to an embodiment of the present invention. Module 125 comprises a conventional FDD unit 129 for nominal 3.5 inch disks with conventional circuitry mounted in a case 130 to provide a module with guides, latches, and a connector matable with connector 35 to be able to plug into a module bay in the notebook computer of the present invention. The case comprises an opening 131 for inserting and withdrawing a floppy disk, and an eject button 133 for ejecting a floppy disk.

A controller 127 communicates with unit 129 over lines 126 and with connector 33 (hence Notebus 89) over lines 128. The unit also derives power from the appropriate pins on connector 33, but these pins and lines are not shown. Controller 127 is an ASIC chip or chip set for translating between the notebus and the FDD unit. Given the data storage standards of the FDD unit and the characteristics of bus 89, it is within the scope of workers with ordinary skill in the art to implement controller 127 without undo experimentation.

Figure 9:
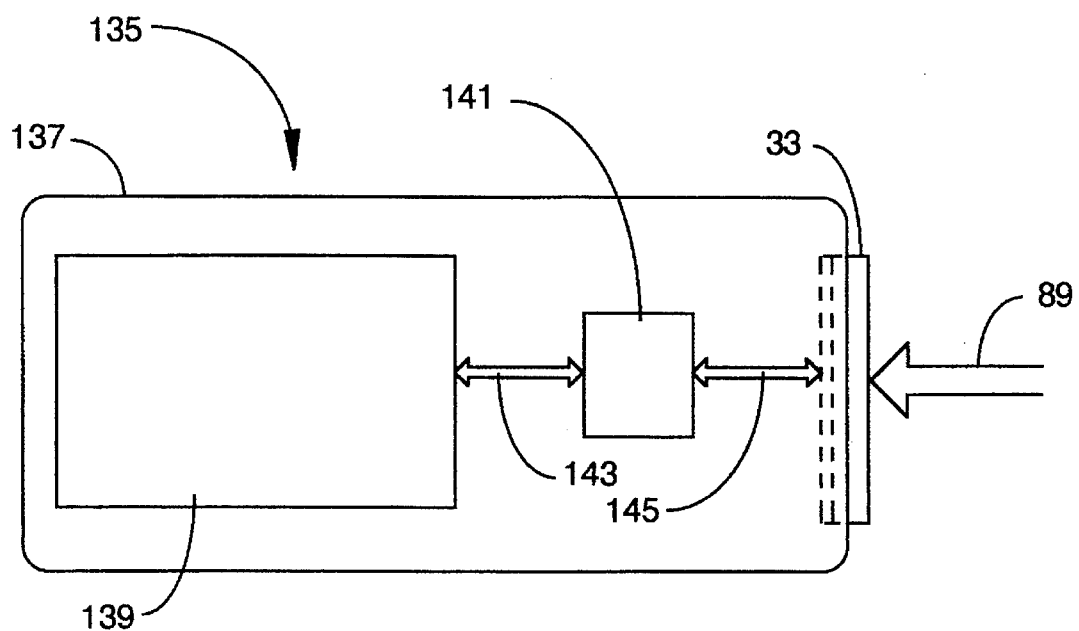
FIG. 9 is a block diagram of a hard disk drive module used in an embodiment of the invention.

FIG. 9 shows a hard disk drive (HDD) module 135 according to an embodiment of the present invention plugged into bus 89 in a module bay of framework 11. HDD module 135 comprises a conventional HDD unit 139 mounted in a case 137 to be compatible with plugging into a notebook computer according to the present invention. As in the case of the FDD module described above, a controller 141 is provided to translate between Notebus 89 and the HDD unit. Controller 141 communicates with HDD unit 139 over lines 143, and with connector 33 over lines 145. Connector 33 is exemplary of any one of the module connectors in the notebook computer.

Given the characteristics of HDD unit 139 and of Notebus 89, it is within the skill of workers in the art to implement controller 141 without undue experimentation. Power line connections are not shown. In implementing controller 141 there are several protocols that may be used. One is the ST506 standard known in the art. Another is the IDE standard known in the art. Yet another is an enhanced IDE, called EIDE, known to the inventors, and the subject of a separate patent application to be filed. In the EIDE protocol, there may be multiple IDE devices daisy-chained and addressed as secondary IDE devices with an additional select number.

Figure 10:
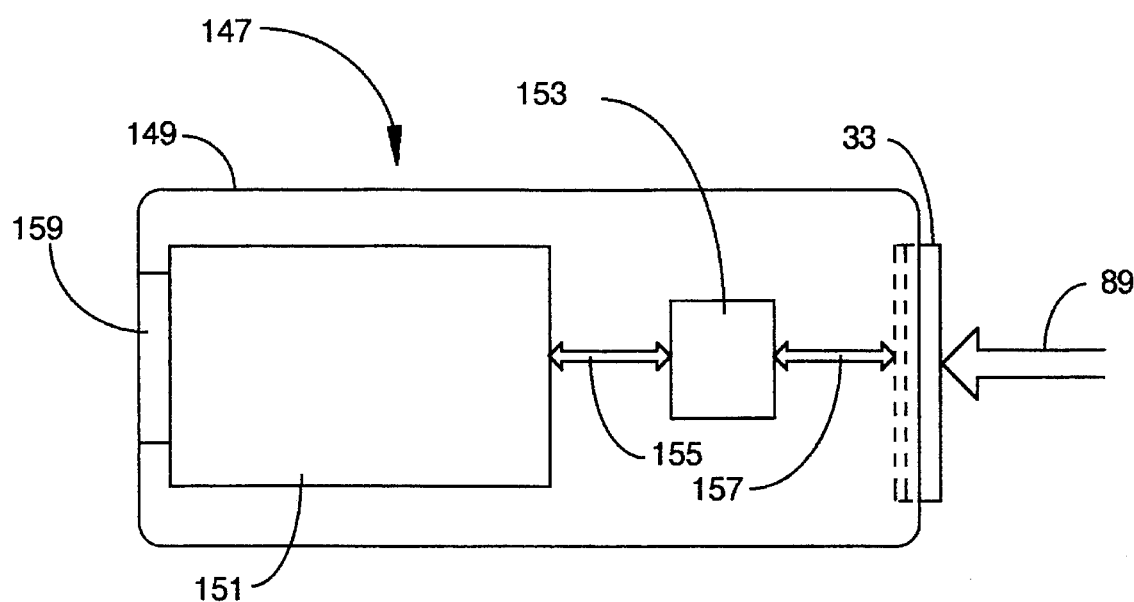
FIG. 10 is a block diagram of a "flash card" memory module according to an embodiment of the present invention.

FIG. 10 shows a "flash card" memory module 147 plugged into connector 33 of the notebook computer of the invention. "Flash cards" are RAM memory cards known in the art pluggable into typically parallel ports o make connection with internal bus structures of a computer. Module 147 comprises a conventional "flash card" 151 mounted in a case 149 compatible with the module bay of a notebook computer according to the present invention.

As in cases described above, a controller 153 is needed to accomplish communication between the memory structure of the "flash card" and bus 89. Controller 153 communicates with "flash card" unit 151 over lines 155 and with connector 33 over lines 157. There may optionally be an opening 159 in case 149 and a connector (not shown) within unit 151 for inserting and withdrawing flash cards, so relatively large collections of data may be plugged in as desired. Alternatively the interface may be the modular interface afforded by the plug-in module 147. Again, given the known characteristics of the flash card and of bus 89, implementation of the controller is a matter within the skill of workers in the art.

Figure 11:
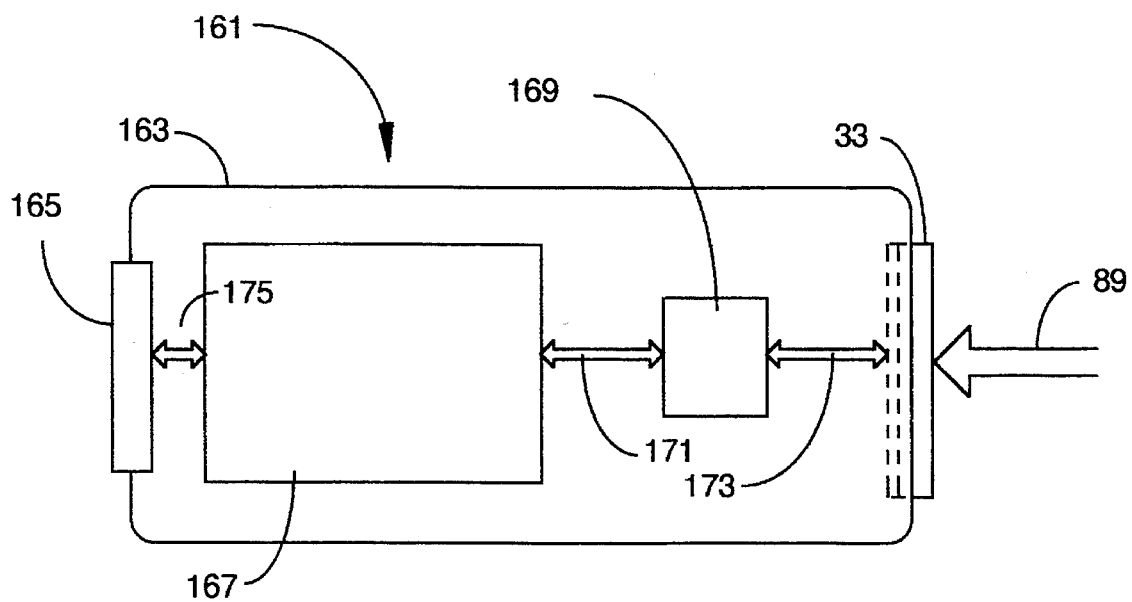
FIG. 11 is a block diagram of a LAN module according to an embodiment of the present invention.

FIG. 11 shows a LAN module 161 plugged into connector 33 of a notebook completer according to an embodiment of the present invention. In the embodiment shown in FIG. 11 a conventional LAN card, such as an Ethernet card, is mounted in a case 163 to be compatible with plugging into a module bay of a notebook computer according to an embodiment of the present invention.

LAN card 167 communicates with a conventional connector 165 in the face of the case of module 161 that, is exposed when the module is plugged into a bay. This is a conventional connector of the sort known in the art for connecting computers on a network.

Within module 161, in a first, alternative, conventional LAN card 167 interfaces to a controller 169 communicating over lines 171 and 173, and the controller translates between bus 89 and the conventional LAN card. In a second alternative, a LAN card is provided with the translation built in, so no separate controller is needed. The first alternative is preferable.

Figure 12:
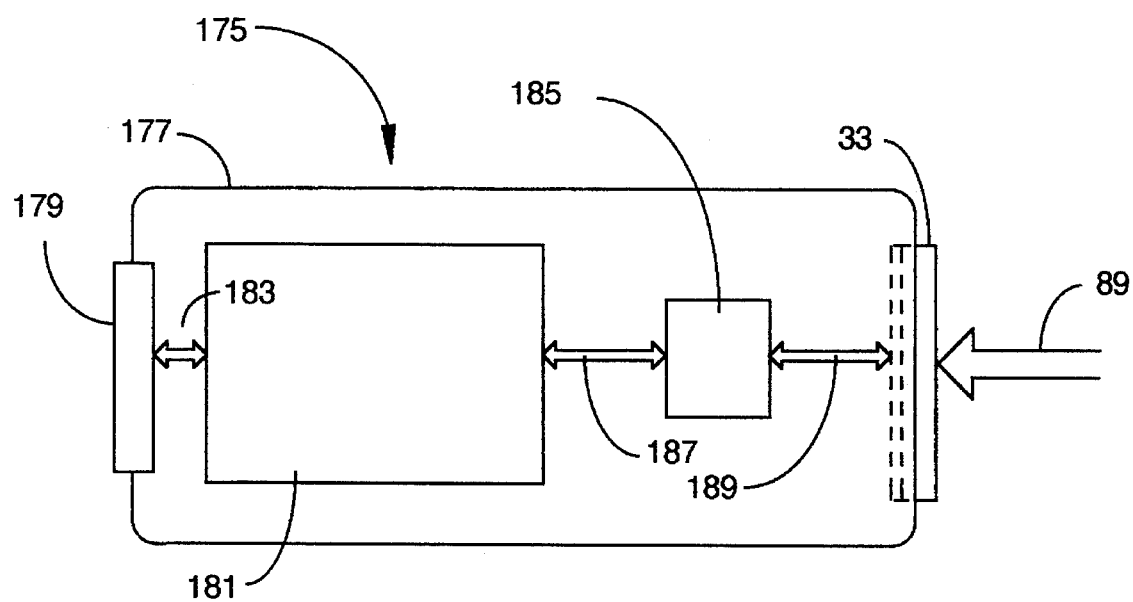
FIG. 12 is a block diagram of a modem module according to an embodiment of the present invention.

FIG. 12 shows a modem module 175 plugged into connector 33 in a bay of a notebook computer according to an embodiment of the present invention. Modem module 175 comprises a conventional modem card 181 mounted in a case 177 to be compatible with plugging into a module bay. In this case, and other cases above, where the term "conventional" is used in conjunction with a card or unit, it is meant that the circuitry and function is conventional. The size may be adjusted to be compatible with a module case for plugging into a bay of a notebook computer according to the present invention.

Modem card 181 connects over lines 183 to a telephone interface 179, which may comprise more than one "jack" so a hand set may also be connected. Card 181 communicates to Notebus 89 over lines 187 and 189 through controller 185, which translates between the conventional card and the compressed bus. Alternatively, the translation components may he implemented on a single card along with the modem circuitry.

Figure 13:
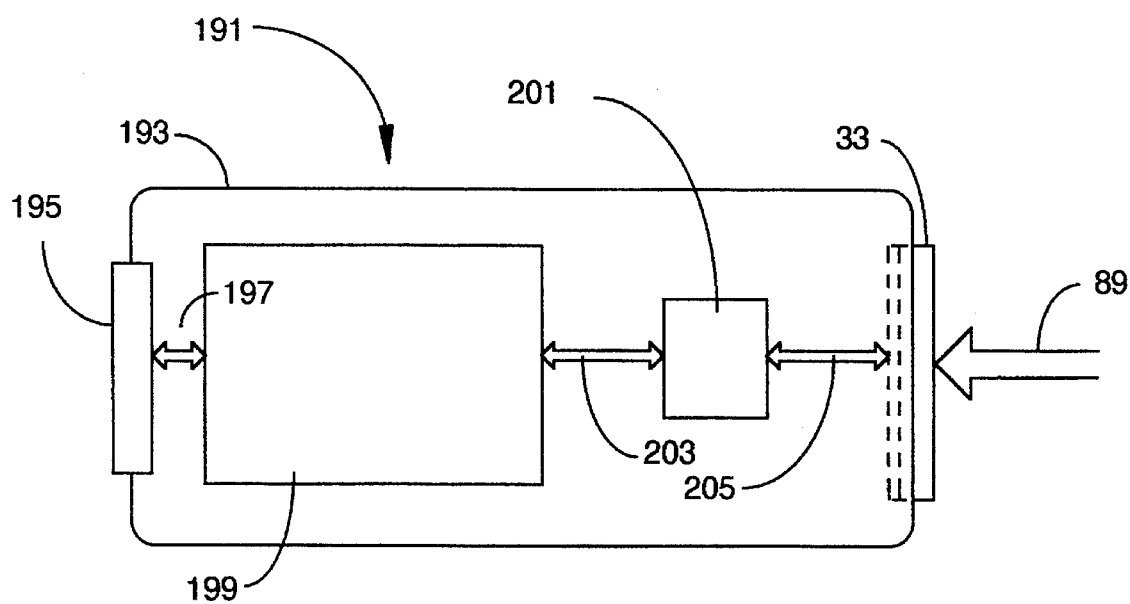
FIG. 13 is a block diagram of a FAX module according to an embodiment of the present invention.

FIG. 13 shows a FAX module 191 plugged into connector 33 of a module bay in an embodiment of the present invention. Module 191 comprises a conventional FAX card 199 mounted in a case 193 to be compatible with plugging into a module bay in the present invention. Fax card 199 communicates over lines 197 with a telephone interface 195, which may, as in the case of the modem module described above, have more than a single telephone "jack".

A controller 201 provides an interface for the conventional FAX card between the card and Notebus 89 over lines 203 and 205. Alternatively, the controller may be implemented on the same card as the FAX circuitry. In yet another alternative, the FAX capability and the modem capability described above may be implemented into a single module.

Figure 14:
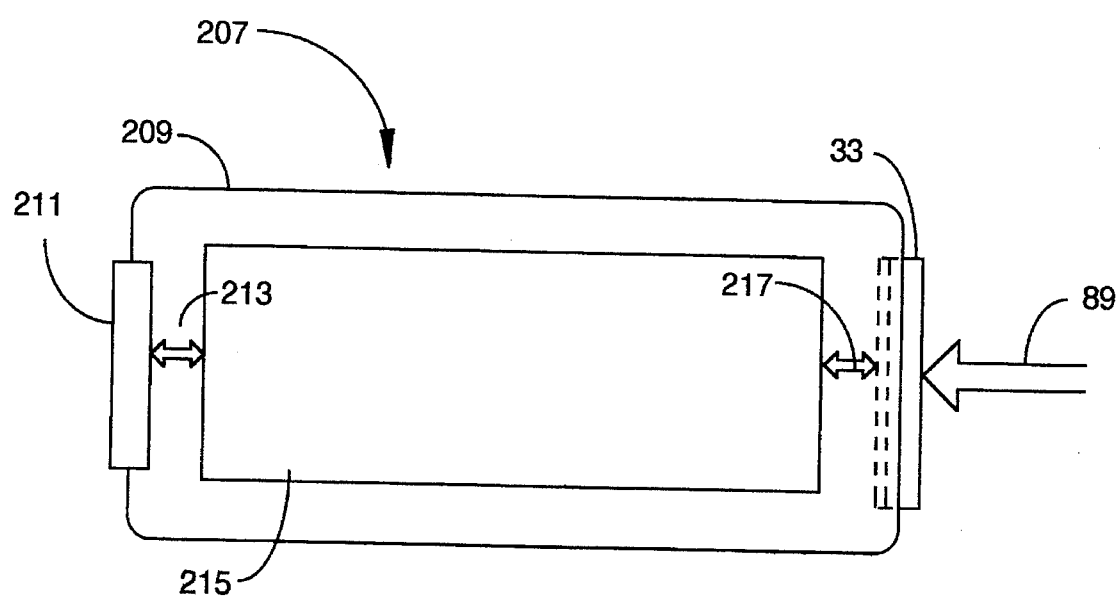
FIG. 14 is a block diagram of a data acquisition module according to an embodiment of the present invention.

FIG. 14 shows a specialty data acquisition module 207 plugged into connector 33 in a module bay in a notebook computer according to an embodiment of the present invention. Module 207 comprises a circuit card 215 mounted in a case 209 to be compatible with plugging into a module bay. Card 215 communicates over lines 213 to an interface 211 which may comprise one or several acquisition leads for connecting to outside equipment. For example, a data module may be provided For following the output of the vertical and horizontal sweep of an oscilloscope, and would have at least two input leads; one for the vertical and one for the horizontal sweep.

Card 215 communicates over lines 217 to connector 33, hence Notebus 89. The circuitry on card 215 is designed to digitize the input if the input is analog, and to be compatible with Notebus 89. Given the characteristics of signals to be measured and the characteristics of Notebus 89, implementation of such a card is within the ordinary skill in the art.

The embodiments of the present invention described above relate primarily to notebook type computers. However, the invention has broader applications. The principles of the invention are also applicable to portable computers known as palmtop computers, and further embodiments are described below.

Figure 15A:
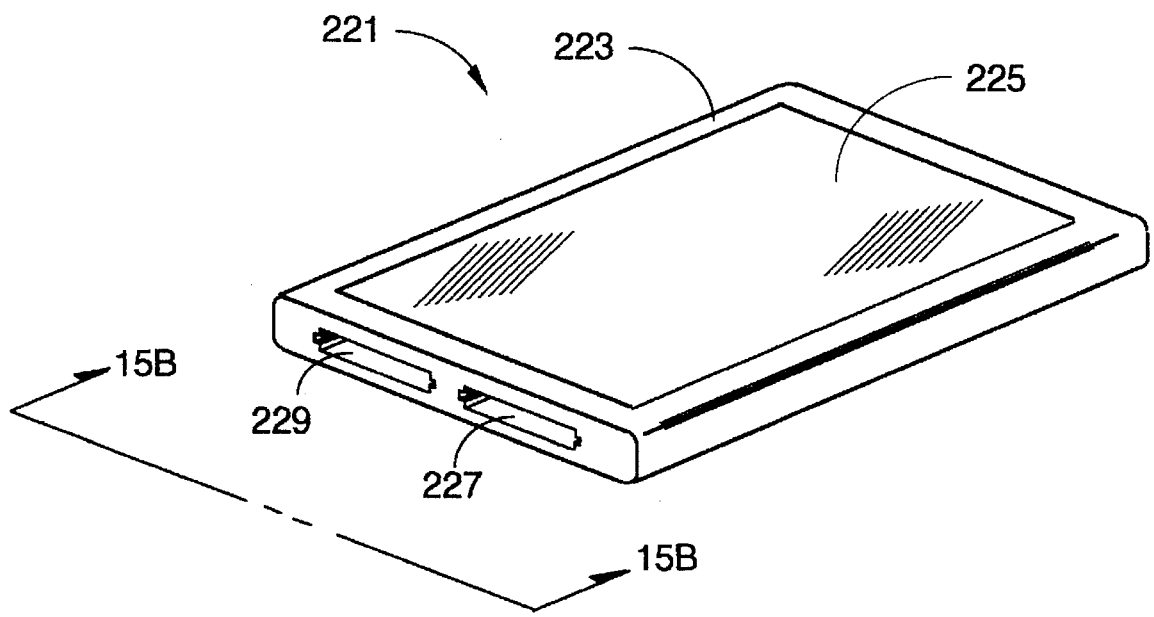
FIG. 15A is an isometric view of a modular palmtop computer framework according to an embodiment of the present invention.

FIG. 15A is an isometric view of a modular palmtop computer 221 according to an embodiment of the invention. Computer 221 is approximately the size of one-half a standard piece of paper (approximately 5.5 inches by 8.5 inches) and in a preferred embodiment comprises a planar array of four Personal Computer Memory Card International Association (PCMCIA) Type II module bays in a case 223.

In this embodiment case 223 has a combination I/O area 225 implemented on one side of computer 221, comprising a display overlaid with a touch sensitive planar structure. In other embodiments, the display may be a flat-panel display pivoted to the case, or a separate monitor in communication with case 223. The touch screen provides a "softkey" operation in conjunction with interactive control logic. In a preferred embodiment of the invention, the control logic resides in static or dynamic memory within case 223 but may also be part of an installed PCMCIA-type peripheral. A power unit (not shown) is enclosed within case 223 for converting electrical input on a wide variety of standards to the form required by the computer. For example, there is a port (not shown) for connecting to a standard household outlet, rated at 120 V., 60 Hz, alternating current. The power unit converts the input to outputs as needed by the computer bus and function modules. There are also input ports for 6 V. DC, 12 V. DC, 9 V. DC, and others, and the power unit in one embodiment of the present invention is capable of recognizing the input characteristics by sampling, and switching to proper onboard circuitry to utilize the input.

in the embodiment of the invention shown by FIG. 15A, two module bays 227 and 229 are provided on one side of case 223. There are two more module bays along the other side of the case opposite the module bays shown. In other embodiments bays may open to other edges of the case. The configuration provides a good balance between the need to stay small and simple, and to also have adequate versatility. In alternative embodiments other module configurations may be used, such as PCMCIA Type III, and others. In the alternative configurations the arrangement of the planar array of modules may vary as well.

Figure 15B:
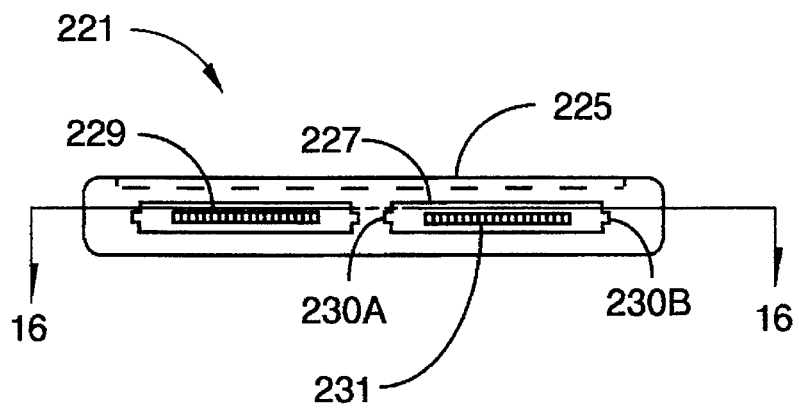
FIG. 15B is a view of the computer framework of FIG. 15A from one side from the vantage of line 15B—15B on FIG. 15A.

FIG. 15B is a view of computer 221 in the direction of arrows 15B—15B of FIG. 15A. I/O area 225 is located on top of case 223. Module bay 227 has a set of guide slots 230A and 230B. The guide slots are to position and guide a PCMCIA module card inserted into the module bay. Each module bay in this embodiment is configured to PCMCIA dimensional and connective standards and secures the fitted PCMCIA cards according to those standards. In this embodiment of the present invention, case 223 has bays configured to PCMCIA type 2, revision B standard. In another embodiment of the invention, the case may have other types of PCMCIA module bays, or bays configured to one or another proprietary standard.

Each module bay has a bus connector, such as connector 231. In this embodiment, connector 231 is a standard PCMCIA connector that accepts PCMCIA cards and is electrically connected to the palmtop's internal bus. It will be apparent to those with skill in the art that there are a number of equivalent ways to connect a function module.

Figure 16:
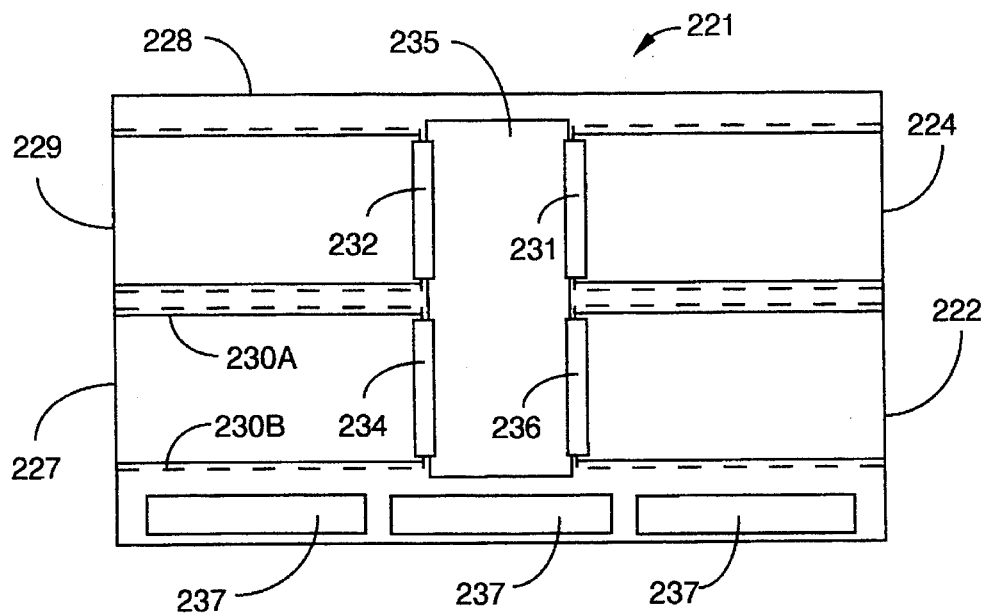
FIG. 16 is a sectioned plan view of the computer framework of FIG. 15A taken along section line 16—16 of FIG. 15B.

FIG. 16 is a simplified plan sectional view of computer 221 taken according to section line 16—16 of FIG. 15B. Frame 228 frames four PCMClA module bays 222, 224, 227 and 229 arranged in a planar array. A printed circuit board structure 235 is fastened and positioned down the center of frame 228, and connectors 231, 232, 234 and 236 are connected to the printed circuit board structure and present their pin structure outward toward the respective bay areas. In the presently described embodiment, the internal connectors are male connectors, but this is not a requirement of the invention.

Slots 230A and 230B serve to guide a PCMCIA-type card into module bay 227, and similar slots are located in each of the other module bays shown as dotted lines in the sectional view. A set of three AA batteries 237 are located generally in the plane of the module bays and provide a portable power means in one embodiment. In another embodiment, outside power sources may power computer 221 as described above.

Figure 17:
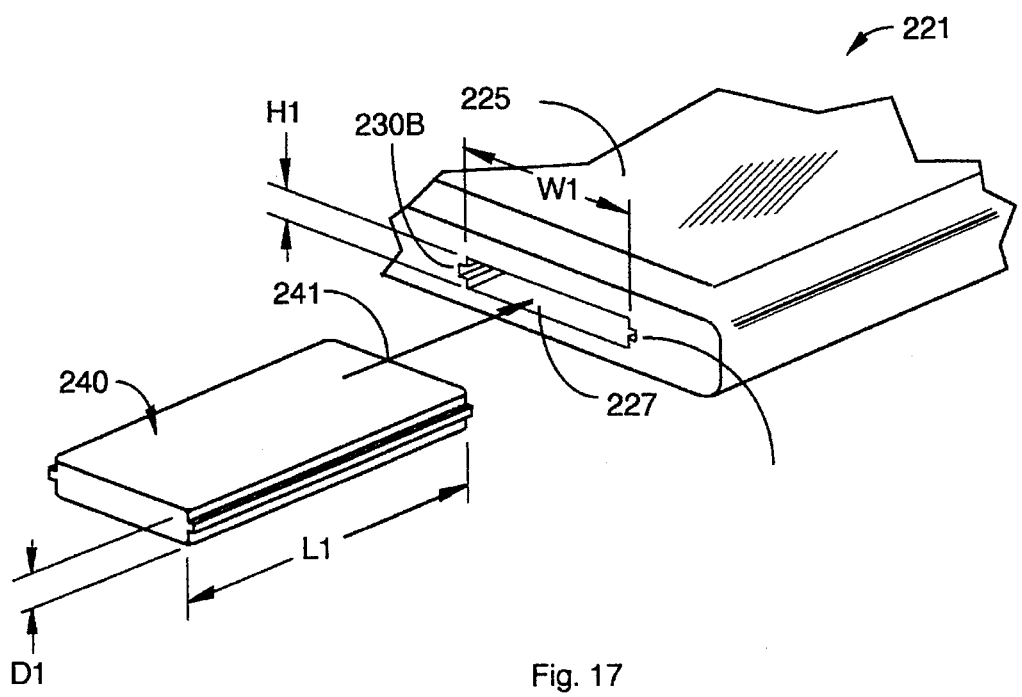
FIG. 17 is an isometric illustration showing a function module and a dedicated docking bay in an embodiment of the present invention.

FIG. 17 is a partial isometric view of a function module 240 according to an embodiment the invention, aligned with module bay 227 of computer 221. Arrow 241 shows the direction of insertion of the function module. I/O area 225 is implemented on top of case 223 in a plane parallel with the plane of the module bays. Module 240 is a Type 2 PCMCIA card and has a thickness D1. The opening of module bay 227 has width W1 and height H1. The length of function module 240 is L1. In this embodiment of the present invention, these dimensions conform to PCMCIA industry standards. In an alternative embodiment of the present invention, module bay 227 may change in dimension to accommodate other standard or proprietary modules.

Module bay 227 engages function module 240 in the full inserted position according to PCMCIA standards. In another embodiment of the invention, detents may be provided similar to those in FIG. 3 for the larger notebook computer embodiment. There are a number of ways known in the art to position and secure a small module. Securing a module may also be accomplished by other means, such as clamping or wedging and/or closing retaining mechanisms.

Figure 18:
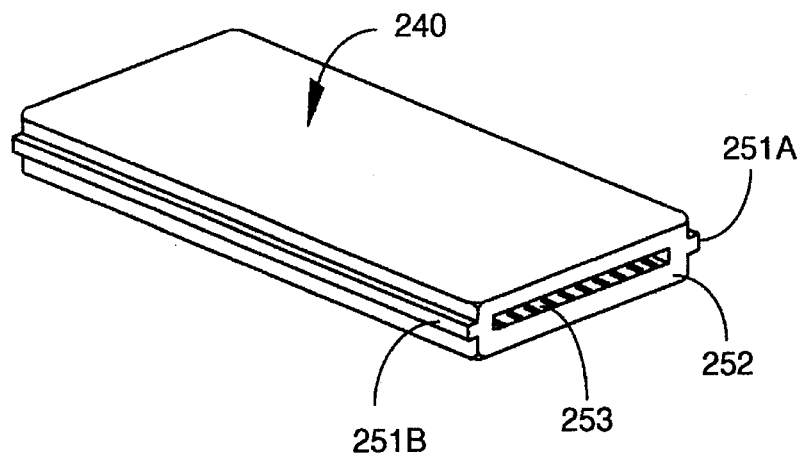
FIG. 18 is another view of a function module according to an embodiment of the present invention.

FIG. 18 is an enlarged isometric view of function module 240 according to Type 2 PCMCIA standards. Back face 252 includes a female connector 253 for mating with a male connector positioned in each module bay, such as connector 231 in FIG. 15B and FIG. 16. Connectors 231 and 253 are PCMCIA connectors and interface according to that industrial standard. Guide 251A and 251B are sized according to the PCMCIA standards.

Function modules are provided in many models capable of a wide range of functions. For example, computer 221 in one embodiment has no onboard CPU or system memory. These functions are provided by function modules that may be inserted in any one of the available module bays. Other kinds of function modules that may be inserted include I/O system modules that provide speech-based, pen-based or keyboard based input. There are also floppy-disk drives, hard-disk drives, flashcard memory modules, LAN and modem adapters, Fax modules, specialty modules such as data acquisition modules adapted to specific equipment, specialty video modules, modules to adapt scanner periherals to the computer, telephone adapters, and more. In the case of I/O modules, necessary software, and in some cases firmware and hardware, may be connected to the internal bus structure by the insertion of a module. For example, a module is provided in one embodiment comprising an induction coil and a controller for decoding signals received via a varying magnetic field and providing code to the computer's internal bus. The varying magnetic field is produced by a stand-alone keyboard wherein the keystrokes are coded and transmitted as signals on the field.

In another embodiment, a similar module provides for communication from an auxiliary pen-based input pad. In yet another embodiment, a plug-in nodule provides a microphone, DSP circuitry, and necessary software to accept input from a user by voice, and to convert the voice input to machine-readable code. Provision of the necessary software and circuitry in these instances in module form provides for maximum flexibility an upgradability for modular systems according to the invention.

Electronic Architecture

Figure 19:
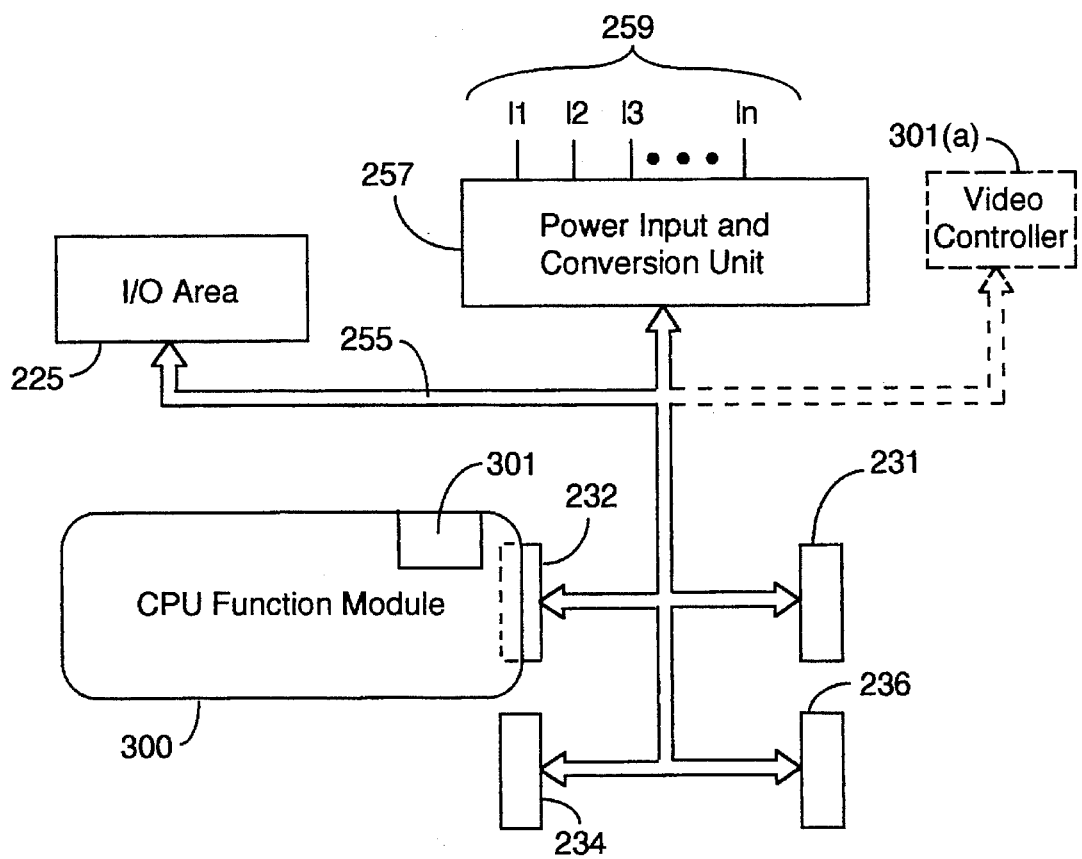
FIG. 19 is a block diagram of a compressed bus and connection to docking bays in a computer framework according to an embodiment of the present invention.

FIG. 19 is a block diagram showing internal elements of palmtop computer 221, connected to show the electronic architecture of the modular computer according to an embodiment of the invention. A power input and/or conversion unit 257 is housed in case 223 (FIG. 15A) and has ports 259 for power inputs. Power input may be from AA batteries 237 (FIG. 16) or from an optional conversion unit via outside electrical sources. Conversion unit 257 senses the input conditions and selects appropriate circuitry to convert the input to the voltages needed to power the elements of the system. Output from the conversion unit is to bus 255, which comprises paths for power as well as for digital information such as data and addresses.

Because there are a wide variety of function modules, as indicated above and described in more detail below, there needs typically to be more than one power line in bus 255. For example, computer 221 may utilize hard disk drive modules, and these modules are preferably provided without onboard power sources. The motor drive for a hard disk requires a different power configuration (voltage and current) than does a CPU, for example, so there may be parallel power lines of differing size and voltage level in bus 255. Bus 255 may have a line for 24 V PC, another for 12 V DC, and yet another for 5 V DC, as well as perhaps multiple ground lines.

Bus 255 connects I/O area 225 and transmits video signals from a video controller. The video controller may be integral to a function module, which is shown as video controller 301 in a CPU function module 300, or implemented in the case, shown as optional video controller 301(a). As described above in a preferred embodiment of the present invention, I/O area 225 is a combination display with an overlaid touch sensitive screen. In another aspect, the I/O area may comprise an active-matrix display, in which case, dedicated analog driver lines from video controller 301 connect to the display. I/O area 225 may also comprise a conventional LCD display wherein I/O control logic is a function of an installed and dedicated I/O peripheral modules. In an alternative embodiment, video controller 301 is built into case 223 (FIG. 15A), and connected directly to bus 255, similar to the modular notebook computer described above.

Bus 255 connects to each of module bays 222, 224, 226 and 227 (FIG. 16) through connectors 232, 234, 236 and 231. When a function module, such as CPU module 300, is inserted into a module bay, female connector 253 (FIG. 18) mates with the respective male connector 232 located in that module bay, and circuitry inside the CPU module is then connected to bus 255.

Palmtop Function CPU Module

The onboard video controller 301 built into CPU function module 300 is a unique feature in one aspect of the present invention. A user is provided an ability to tailor the CPU power and type of video controller to the other modules and applications for palmtop computer 221. This provides a simple means for upgrading by switching CPU function modules. Video signals are local to the CPU, which increases system performance.

Figure 20:
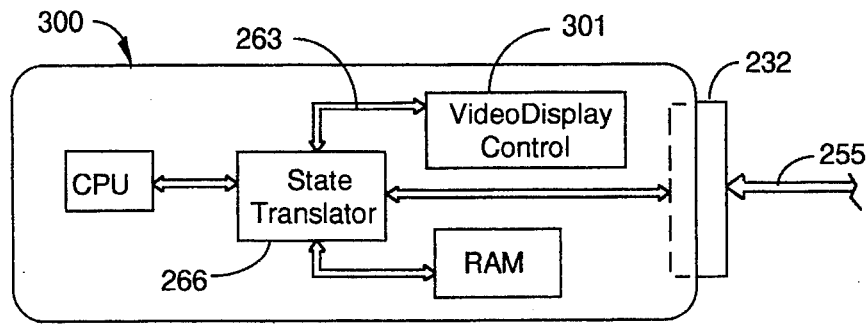
FIG. 20 is a block diagram of a CPU function module according to an embodiment of the present invention.

FIG. 20 is a more detailed diagram of CPU module 300 for computer 221. CPU module 300 is similar in function to CPU module 99 (FIG. 6), except for the addition of video controller 301. Onboard video controller 301 is bus connected by line 263 to a state translator 266. In this embodiment of the invention, the state translator is configured to transmit and receive video signals and commands over bus 255 via connector 231 as well as other functions as described above.

Other Aspects and Features

The embodiments of the present invention described above specifically address notebook-type and palmtop-type computers. The embodiment described below addresses yet another aspect of the palmtop type computers.

Figure 21:
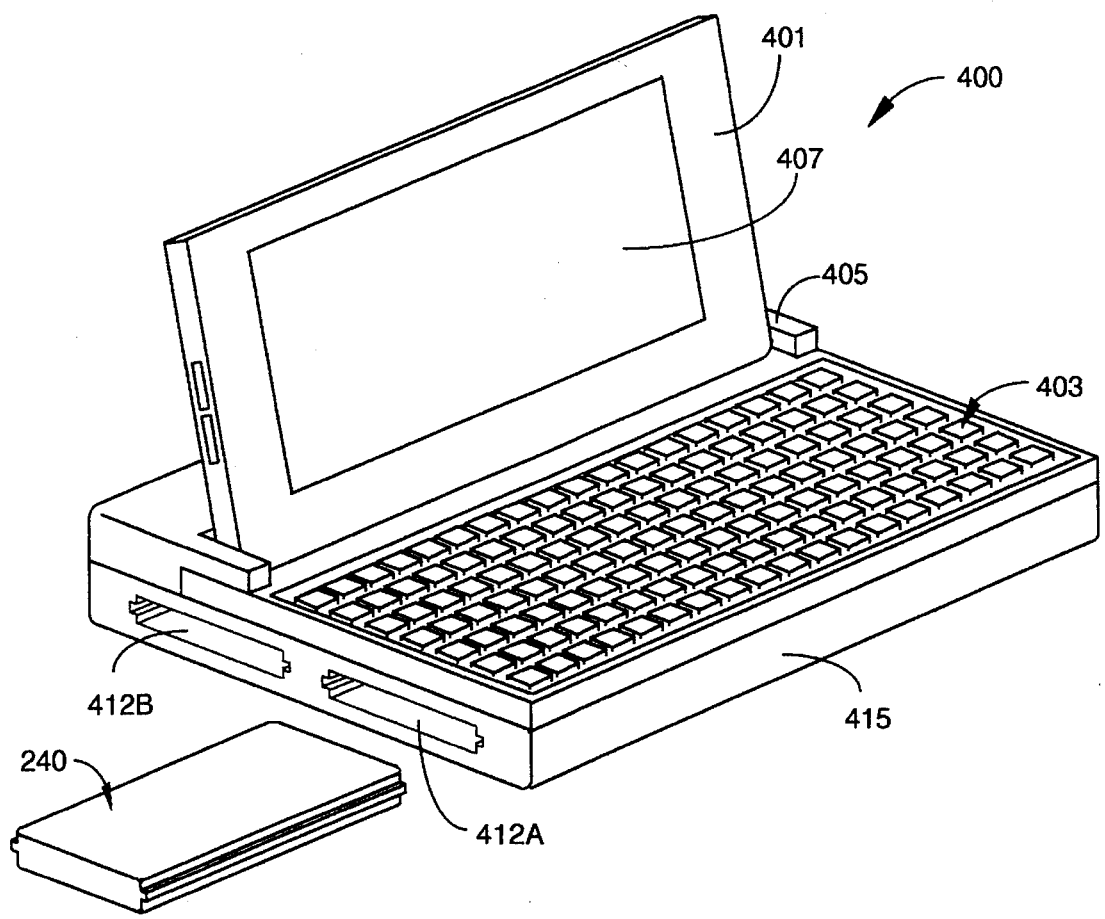
FIG. 21 is an isometric drawing of modular palmtop computer according to another embodiment of the present invention.

FIG. 21 is an isometric drawing of another embodiment of the present invention. Computer 400 comprises an attached pivotable display case 401 and a fixed keyboard 403. The display case rotates about a hinge 405 and closes in a fixed detented position above the keyboard. Display case 401 comprises a flat-panel display 407. There are two PCMCIA-type module bays 412A and 412B on one side of the case, and two more (not shown) on the side opposite. The four PCMCIA module bays are arranged in a planar array as described above. A frame 415 contains a bus structure (not shown) that interconnects all aspects of the PCMCIA type module bays to computer 400 as described above. In this embodiment of the present invention, a standard keyboard controller (not shown) enclosed in frame 415 connects keyboard 403 to the internal bus structure.

It will be evident to one with skill in the art that there are many changes that might be made without departing from the spirit and scope of the invention. Many of these alternatives have been described above. For example, there may be more than the four module bays described, or fewer. There may also be more than one planar array of module bays. To provide more docking bays in a compact arrangement, one might provide two or more planar levels, with multiple docking bays in each plane. Similarly, there are many ways modules may be built to be docked in a framework such as computer 11, 221 and 400 to form a planar array. There are similarly many different kinds of connectors that might be utilized as well as many kinds of compressed buses that can be used. There are many kinds of modules that may be provided, and many other changes that might be made within the spirit and scope of the invention.

What is claimed is:

1. A modular computer comprising:

a case having contiguous walls, the case for supporting and enclosing elements of the modular computer;

a plurality of separate module bays in a common plane, each module bay comprising a walled cavity in the case having an open outboard end and an inboard end closed by an end wall, wherein the walls of each cavity, including the end wall, comprise an extension of the contiguous walls of the case;

a multi-pin electrical connector mounted through the inboard wall of each module bay;

an internal bus within the contiguous walls of the case connected to each of the electrical connectors mounted through the inboard walls of the module bays;

a display; and an input apparatus attached to the case substantially coplanar with the plane of the module bays.

2. A modular computer as in claim 1 wherein each module bay is sized to receive within the cavity and dock a functional module, and wherein each module bay has guides for engaging mating guides on a functional module.

3. A modular computer as in claim 1 wherein the input apparatus is a keyboard and the display is a flat-panel display pivoted to the case and closable over the keyboard for storage and transport.

4. A modular computer as in claim 1 wherein the internal bus is a compressed bus for multiplexing data and addresses on a common set of conductors.

5. A modular computer as in claim 1 wherein the module bays open to two opposite edges of the case, and the internal bus is implemented in a central spine between the inboard walls of opposite module bays.

6. A modular computer as in claim 5 comprising four module bays, two module bays opening to each of the opposite edges of the case.

7. A modular computer as in claim 1 wherein the module bays open to adjacent edges of the case.

8. A modular computer as in claim 1 further comprising a CPU function module having a CPU microprocessor, wherein, upon docking, the CPU microprocessor becomes the CPU of the modular computer.

9. A modular computer as in claim 8 further comprising a video controller and a random access memory connected to the CPU microprocessor.

10. A modular computer as in claim 1 further comprising an input control function module configured for receiving input signals from a separate input apparatus.

11. A modular computer as in claim 10 wherein the separate input apparatus is a keyboard, and the input function module is configured to receive keystroke signals from the keyboard and to communicate the keystroke signals to the internal bus.

12. A modular computer as in claim 10 wherein the input function module is configured to receive input signals from a pen-pad separate input device, and to transmit the input signals to the internal bus.

13. A modular computer as in claim 10 wherein the input function module comprises a microphone and a digital signal processor for receiving voice input, converting the voice input to computer-operable code, and transmitting the computer operable code to the internal bus.

14. A modular computer as in claim 1 further comprising an input/output control function module, the input/output control function module configured as one of a serial telephone modem, a LAN modem, a floppy disk drive, a hard disk drive, a FAX modem, and a data acquisition modem.

* * * * *